US006359915B1

(12) United States Patent
Koch et al.

(10) Patent No.: US 6,359,915 B1
(45) Date of Patent: Mar. 19, 2002

(54) WAVELENGTH-STABILIZED BRAGG LASER

(75) Inventors: Thomas L. Koch, Holmdel; Xing Pan, Morganville, both of NJ (US)

(73) Assignee: Agere Systems, Orlando, FL (US)

( * ) Notice: Subject to any disclaimer, the term of this patent is extended or adjusted under 35 U.S.C. 154(b) by 0 days.

(21) Appl. No.: 09/401,901

(22) Filed: Sep. 23, 1999

(51) Int. Cl.[7] .............................. H01S 3/13; H01S 3/00; H01S 3/08
(52) U.S. Cl. ................ 372/29.02; 372/29.011; 372/29.016; 372/38.02; 372/96; 372/102
(58) Field of Search .................. 372/20, 29.011, 372/29.015, 29.02, 31, 32, 96, 102, 38.02, 29.016

(56) References Cited

U.S. PATENT DOCUMENTS 5,450,428 A * 9/1995 Maeda ..................... 372/20
5,654,814 A * 8/1997 Ouchi et al. ............. 359/156

* cited by examiner

Primary Examiner—Frank G. Font
Assistant Examiner—Armando Rodriguez
(74) Attorney, Agent, or Firm—Wendy W. Koba

(57) ABSTRACT

A stabilized single-longitudinal-mode laser where stabilization is performed through a pair of Bragg reflector mirrors slightly displaced in wavelength to either side of the longitudinal mode selected for operation. Transmitted signals through each Bragg reflector are detected and used in an electrical servo loop to control the relative positions of the longitudinal mode selected for operation and the peak wavelengths of the two Bragg reflector mirrors.

7 Claims, 2 Drawing Sheets

WAVELENGTH-STABILIZED BRAGG LASER

FIELD OF THE INVENTION

This invention relates to a laser and more particularly to a Bragg laser whose wavelength is stabilized.

BACKGROUND OF THE INVENTION

The growing use of wavelength division multiplexed (WDM) optical networks for use in communications has created a need for lasers whose operating wavelength can be stabilized to a high degree. In particular, as the number of channels in such networks has increased and the difference in operating wavelength between channels has narrowed, it has become particularly important to stabilize the operating wavelength of each channel and accordingly, the wavelength of the laser serving as the transmission source for the channel. In addition, desired increases in functionality and cost control have created a need for lasers that can be programmed to operate sequentially at a number of the different wavelengths corresponding to different channels in the WDM network. The lasers satisfying this need will still need to be highly stabilized at a particular channel once it has been selected.

Presently, the transmission source for each channel typically comprises an individual fixed-wavelength laser stabilized against an optical reference to a wavelength desired for a particular channel. The individual laser used for each channel is typically a distributed feedback (DFB) laser. Such a laser generally includes a multilayer semiconductor chip of which one layer is of a composition to provide gain in the wavelength band of intended operation when suitably pumped. A second layer is typically included, adjacent and parallel to the gain layer, which contains a corrugated surface. This corrugation forms a grating to introduce distributed feedback thereby fixing the laser's specific operating wavelength at a value primarily determined by the periodicity of the grating. Specifically, the grating serves to preferentially select one longitudinal mode of the laser cavity for operation by reducing its optical loss to a value lower than any other longitudinal modes. Typically the operating wavelength of the preferentially selected longitudinal mode of the laser is further stabilized by control of the temperature at which the semiconductor chip is kept. This temperature control fixes the index of refraction of the laser materials and the chip length, and hence the characteristic wavelength of the corrugated grating. This temperature control of the laser is then used to fine-tune and lock the laser using an external optical reference in a servo loop to align the operating wavelength to the value prescribed for a particular channel in the WDM optical network.

Typically, for providing a control voltage for stabilization of the wavelength, a sample of the laser light is passed through an optical filter, external to the laser cavity, whose transmission and reflection characteristics show a significant wavelength dependence in the region where the wavelength channel is to be locked. Samples of the transmitted and reflected light are compared in amplitude, typically using photodetectors, and differences in these amplitudes are used to generate a voltage using a differential amplifier, for example. This voltage is used to change the temperature of the laser to control in turn the differences in amplitudes of the two samples to zero or some calibrated value, and hence to stabilize the laser at a desired wavelength. Such an arrangement is described in U.S. Pat. No. 5,299,212, entitled, "Article Comprising a Wavelength-Stabilized Semiconductor Laser," by Thomas L. Koch and Sheryl L. Woodward, issued Mar. 29, 1994.

Recent developments in WDM optical networking have made clear the potential of tunable transmitters. Such transmitters may be used to dynamically allocate a given data content to a particular wavelength channel for further routing in the network. Alternatively, tunable transmitters may be used for cost reduction by allowing a particular transmitter assembly to be available as a spare for failure protection, and such an assembly could protect against failure for a number of WDM transmitter channels. However, this provision of tunability brings further complexity to the stabilization discussed above.

One typical configuration for a tunable laser comprises a tunable optical filter within the laser cavity that preferentially selects out one longitudinal mode of the laser for operation in the system. This filter can be an intra-cavity narrow-band transmission filter, or a narrow-band reflector serving as an end mirror in the cavity. By tuning the optical filter, different longitudinal modes are sequentially selected for operation. A form of laser that offers this mode of operation is the tunable Distributed Bragg Reflector (DBR) laser. A DBR laser differs from a DFB laser in that the corrugated layer that controls the operating wavelength is contained in a section (referred to as the Bragg section) that is aligned longitudinally distinct from the section containing the gain medium (referred to as the gain section). This configuration provides a highly wavelength-selective mirror on one end of the laser cavity that will preferentially provide low losses to the longitudinal mode nearest to the peak reflectivity of the mirror. Furthermore, the Bragg section is usually comprised of layers whose index of refraction can be controlled independently from that of the gain section. This is typically done by constructing the Bragg section from materials that are nominally transparent at the operating wavelength, but change their index of refraction when electrical currents are injected into their constituent layers. As a consequence of these features, the wavelength-selective mirror provided by the Bragg section can be tuned in wavelength to sequentially select out different longitudinal modes for operation.

With these properties, a DBR laser allows for the selection of the operative longitudinal mode independently from the fine tuning discussed for wavelength stabilization of a DFB laser. However, temperature tuning of a DBR laser is possible just as in the DFB laser, generally adjusting the index of refraction and length of the Bragg section at the same rate as the index of refraction and length of the gain section. This results in the center wavelength of the Bragg section tracking the wavelength of the selected longitudinal mode as temperature is changed. As such, the selected longitudinal mode remains suitably aligned in wavelength near the peak reflectivity of the Bragg mirror when the temperature of the whole laser is altered, maintaining stable single longitudinal mode operation.

Using the independent control for longitudinal mode selection afforded by the Bragg section, the DBR laser then allows for both a coarse tuning through mode selection, by adjusting the index of the Bragg region with current injection for example, and fine tuning, by adjusting the temperature of the whole laser. In this respect the stabilization discussed in the context of the DFB laser can still be used with temperature control, for example, to stabilize the operating wavelength of the DBR against an external optical reference filter.

However, this stabilization scheme does not address the stabilization of the alignment of the Bragg section peak reflectivity wavelength with respect to the selected longitudinal mode chosen for operation in the system. In particular, it is known that aging effects in semiconductor optoelectronic structures such as lasers can alter the exact relationship between injection current and gain or index of refraction after substantial periods of operation. In this case, the initial injection current setting resulting in a particular alignment of the Bragg section mirror peak reflectivity over a selected longitudinal mode can drift, ultimately leading to a misalignment severe enough to change the identity of the selected longitudinal mode. That is, the drift can be large enough such that a new, previously discriminated against, longitudinal mode has higher reflectivity than the originally selected mode, and the laser will hop to this new mode with lower losses in the optical cavity. This event would constitute a substantial coarse tuning, resulting in an undesirable change in wavelength of operation and hence errors in the system.

The aforementioned need for stabilizing the alignment of the Bragg section center wavelength with respect to the selected longitudinal mode of operation has been known for some time. In the past tunable DBR lasers have been stabilized by locking the Bragg section center wavelength to the selected longitudinal mode through the use of a dithering signal and phase-sensitive detection. The dithering signal is applied to the Bragg section while monitoring either the transmission through the Bragg section or the output of the laser. Since these are affected by misalignment of the Bragg section center wavelength either to longer or shorter wavelength, the use of phase-sensitive detection allows for a servo loop to lock the peak of the Bragg section wavelength-selective mirror to the longitudinal mode. Such an arrangement is described in U.S. Pat. No. 5,220,578 entitled, "Long Term Mode Stabilization for Distributed Bragg Reflector Laser," by Thomas L. Koch and Sheryl L. Woodward, issued Jun. 15, 1993.

The aforementioned longitudinal mode stabilization technique involves extra complexity because of the need to dither dynamically the output. To provide improved stabilization it would be preferable to provide an arrangement that not only allows for temperature tuning to fine-tune and lock to an external optical reference, but also locks the Bragg section peak reflectivity onto a chosen longitudinal mode without requiring a dithering signal.

SUMMARY OF THE INVENTION

The present invention is a laser whose operating wavelength is stabilized by the inclusion of a pair of Bragg grating sections that are separate from the gain medium. This pair of Bragg gratings can serve both to keep the operating wavelength in a single longitudinal mode of its resonant structure, and also to keep the operation such that the chosen longitudinal mode is essentially centered with respect to the composite reflections from the Bragg sections. This configuration also provides a structure where the possibility for the wavelength of operation to jump from the selected longitudinal mode to a different longitudinal mode is essentially eliminated.

To this end, a semiconductor laser that is stabilized in accordance with the invention includes within a resonant cavity of the laser a first gain section comprised of materials and means for pumping such as to provide optical gain in the intended wavelength range of operation. In one form, the resonant cavity may also include a second section that is nominally transparent to the laser light but does introduce a phase shift in the light passing through and so is capable of affecting the precise resonant wavelength of the optical cavity. The index of refraction in this second section is controlled, using current injection for example, to control the optical path length and hence the phase shift it introduces.

Additionally there are included a pair of Bragg reflectors either at opposite ends of the cavity or at the same end of the cavity but in separate bifurcated paths. The critical feature of this pair of Bragg reflectors is that they are displaced in wavelength, but only by a sufficiently small amount that the peak reflectivity of each lies within the reflection band of the other. When these Bragg reflectors are properly configured, either at respective ends of the optical cavity or configured at the two ends of a bifurcated path situated at one end of the cavity, each contributes to the net reflectivity experienced during a round trip in the optical cavity. By monitoring the light transmitted through each of these Bragg reflectors, the alignment of the operative longitudinal mode of the laser can be controlled with respect to the Bragg reflectors.

This can be accomplished by simultaneously controlling the index of refraction of both of the Bragg sections, thereby moving them together while maintaining the difference in respective center wavelengths. Alternatively, this can be accomplished by controlling the index of refraction of the aforementioned phase section to adjust the wavelength of the selected longitudinal mode. In a manner similar to the method described earlier for locking the wavelength of operation relative to an external reference filter, the relative amounts of light transmitted by each of the displaced Bragg reflectors are monitored. A control voltage is generated based on the differences in the light transmitted through each Bragg reflector, and this voltage is used to control the index of refraction of either the Bragg reflector pair or the phase section.

However, in contrast to the method described earlier, this stabilization is not used for absolute wavelength control against external optical reference filters. Rather, it is used to guarantee the stability of the alignment of the wavelength selective optical filter inside the laser cavity, in this case the two Bragg reflectors, with respect to the single longitudinal mode selected for operation. An additional, external, optical reference and servo loop can then be added for absolute wavelength control using the prior art as described earlier.

BRIEF DESCRIPTION OF THE DRAWING

The invention will be better understood when taken in conjunction with the accompanying drawing in which each of FIGS. 1 and 3 show schematically a different illustrative embodiment of the invention

DETAILED DESCRIPTION

Figure 1:
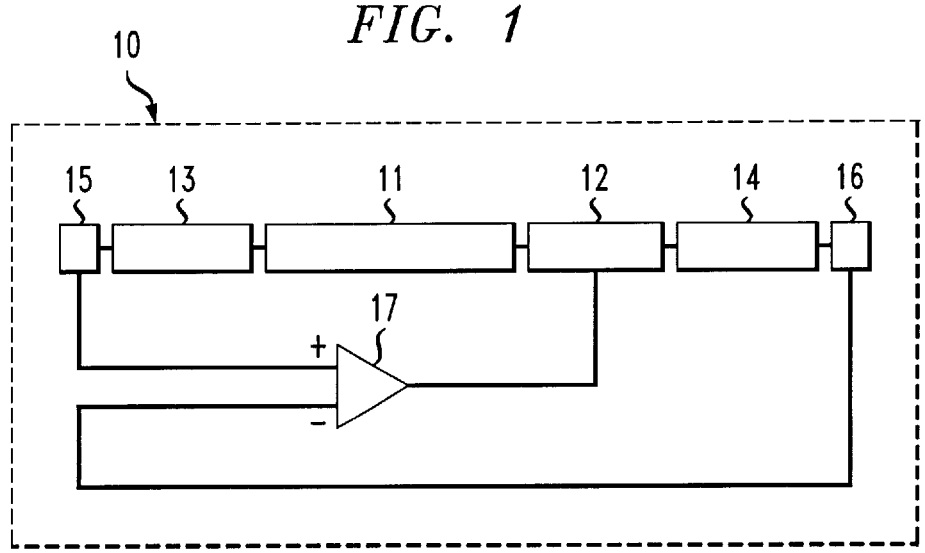

FIG. 1 shows a stabilized laser system 10 that includes a first gain section 11 followed by a phase section 12. The gain section 11 is designed to be the active portion of the laser system and typically will comprise a multilayer semiconductor waveguide in which the various layers are designed appropriately to provide the desired stimulated emission of radiation with appropriate means of pumping, typically by electrical current injection.

Figure 2A:
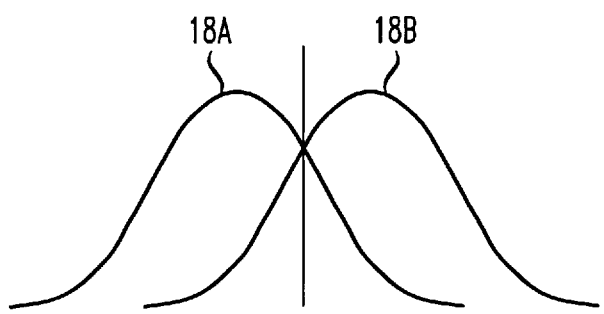
FIGS. 2 and 4 are wave forms useful in describing the invention.
Figure 2B:
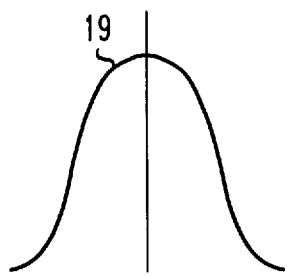

To provide the desired optical filtering in the laser cavity to preferentially select a particular longitudinal mode for operation, the laser system further includes Bragg reflector mirror sections 13 and 14 advantageously at opposite ends of the wave path defined by sections 11 and 12. The center wavelengths of these Bragg reflectors are shifted, respectively, to a value slightly shorter and longer than the wavelength of the longitudinal mode to be selected for operation. The value of the shifts are such that the intended longitudinal mode wavelength is still well within the reflection bands of each Bragg reflector. Since the light reflects off both Bragg reflectors during a round trip in the optical cavity, the net reflectivity response as a function of operating wavelength experienced by the light is the product of the two individual Bragg reflector responses as a function value that lies precisely between the two center wavelengths of the Bragg reflectors. As a result of these two reflections, the net peak reflectivity 19 shown in FIG. 2B can be at a value that lies precisely between the two center wavelength 18A, 18B shown in FIG. 2A of the Bragg reflectors.

The phase section 12 may or may not be present, but if present is designed to adjust the exact wavelengths of the comb of longitudinal modes defined by the laser cavity. For example, the continuous adjustment of this phase section through an additional optical path length leading to a phase shift of $\pi$ will result in a sweeping of the wavelength of the longitudinal modes by one longitudinal mode spacing. This phase section is typically comprised of layers of semiconductors that are nominally transparent to the laser light and serves to introduce a phase shift that tunes the resonant wavelengths of the cavity to a value where a selected longitudinal mode has a clearly defined minimum loss by virtue of its alignment with respect to the Bragg reflectors 13 and 14. As noted above, this wavelength can be designed to be a the value lying between the peak reflectivity wavelengths of each Bragg reflector as illustrated in FIG. 2.

Additionally the system includes optical detectors 15 and 16 advantageously optoelectronic, at the opposite ends of the laser cavity, each positioned to detect a sample of the light passing through its adjacent Bragg mirror. The samples advantageously should be substantially equivalent in amplitude. The voltages detected by the two detectors are supplied as separate inputs to the differential amplifier 17 and any output is used to control the relative location of the selected longitudinal mode wavelength and the center wavelengths of the two Bragg reflector sections 13, 14. This can be accomplished either by changing the index of refraction of both Bragg reflector sections simultaneously, thereby maintaining their displaced center wavelengths with respect to each other, or by changing the index of refraction of the phase section 12 thereby changing the wavelength of the selected longitudinal mode. In either case, the adjustment is made such that the difference in light amplitude detected by the detectors 15 and 16 is brought to a minimum. This process insures that the alignment of the longitudinal mode with respect to the Bragg reflectors is as shown in FIG. 2.

Figure 3:
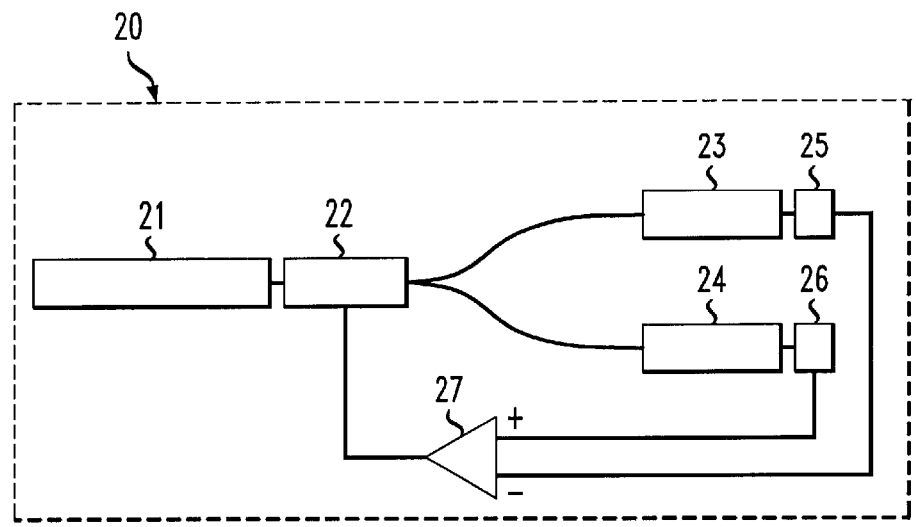
Figure 4A:
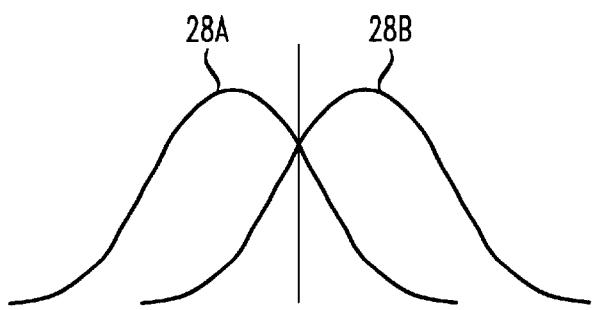

An alternative embodiment of the invention uses a different arrangement of the wavelength-displaced Bragg reflector sections. As shown in FIG. 3, the laser system 20 includes the first gain section 21 followed by the phase section 22 as in laser arrangement 10 of FIG. 1. However beyond phase section 21 the wave path is bifurcated into two paths and a different one of the wavelength-displaced Bragg reflector sections 23 and 24 is positioned across each path. Bragg reflector sections 23 and 24 are similar to sections 13, 14 used in the laser system 10. Again the outputs of each of sections 23 and 24 are detected and the resulting voltages are supplied to the two inputs of the differential amplifier 27. The output of the differential amplifier 27 is used to tune appropriately the the phase control section 22, or simultaneously the center wavelengths 28A, 28B shown in FIG. 4A of the two Bragg reflector sections while maintaining their difference, as in the earlier described embodiment. Again this provides a means to adjust the wavelength of the longitudinal mode selected for operation, relative to the center wavelengths of the two Bragg reflector sections.

Figure 4B:
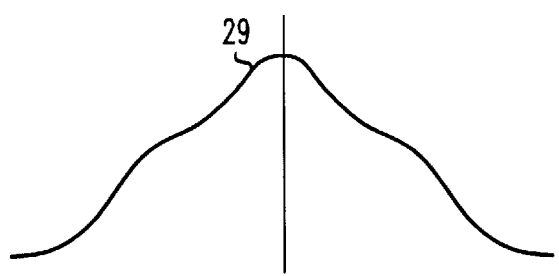

This second embodiment differs in that the net reflection experienced by the light in one round trip is no longer a simple product of the two Bragg reflectors 23, 24. Rather it is proportional to the sum of the reflections from the two Bragg reflectors. However, this sum can still be designed to display a peak value at the wavelength 29 lying between the displaced center wavelengths of the two Bragg reflectors, as shown in FIG. 4B. As such, a longitudinal mode that lies at this value between the two Bragg reflector peaks will be the lowest loss longitudinal mode and hence the stable mode for operation.

The bifurcation to form the two separate paths can advantageously be provided in the case where the sections are formed in a common semiconductor chip by adding a Y-shaped planar waveguide after the phase section 22, thereby splitting into two separate beams for input to the two Bragg mirror reflector sections 23, 24.

In either of the embodiments described above, the wavelength-displaced Bragg mirrors serve to align the center wavelengths of the Bragg reflectors, while maintaining their displacement, relative to the wavelength of the longitudinal mode selected for operation. Once this alignment is performed, and locked using the servo loop described, the output from the laser can still be aligned relative to an external optical reference using the same means as described for a DFB laser. In particular, control of the temperature of the laser chip will maintain the relative longitudinal mode alignment but shift the output wavelength for alignment to an external reference or a value suitable for a channel in a WDM optical network.

In either of the systems described, laser light for utilization can be obtained by using detectors that are partially transmitting, so that the transmitted light exiting from the detectors can be utilized in a system as desired. In the first embodiment described, this is desirable since both ends of the cavity are terminated by the photodetectors used for longitudinal mode stabilization. In the event that the level of the leaked light is lower than desired, an appropriate optical amplifier section can be added after the detector to achieve a desired output light level. In the second embodiment, such partially transmitting detectors may not be necessary since the outer end of the gain section 21 can have a simple partially reflecting mirror whose transmitted light is suitable for utilization in a system.

It is to be understood that the specific embodiments described are illustrative of the general principles of the invention and that modifications can be made therein without departing from the spirit and scope of the invention.

What is claimed is:

1. A stabilized distributed Bragg reflector laser comprising a gain section providing desired stimulated emission along a wave path at a selected longitudinal mode wavelength $\pi$;

a pair of Bragg reflector mirrors, disposed at separate exit locations of said gain section along said wave path, a first Bragg reflector mirror of said pair of Bragg reflector mirrors reflecting emission at a center wavelength slightly longer than the selected longitudinal mode wavelength, and a second, remaining Bragg reflector mirror of said pair of Bragg reflector mirrors reflecting emission at a center wavelength slightly shorter than the selected longitudinal mode wavelength; and an arrangement for stabilizing the selected longitudinal mode wavelength of the laser, said arrangement comprising a first optical detector disposed at the output of the first Bragg reflector mirror and a second optical detector disposed at the output of the second Bragg reflector mirror, said first and second optical detectors generating an electrical correction feedback signal from the first and second Bragg reflector outputs, using the electrical correction feedback signal to modify the relative location of the gain section selected longitudinal mode wavelength with the center wavelengths of the pair of Bragg reflector mirrors to stabilize the laser emission.

2. The stabilized distributed Bragg reflector laser as defined in claim 1 wherein the laser further comprises a differential amplifier, comprising a pair of input terminals and a output terminal, for providing as an output a difference signal representative of the difference between the inputs applied thereto, the outputs from the first and second optical detectors separately coupled to said pair of input terminals of said differential amplifier, the difference signal appearing at the output terminal forming the electrical correction feedback signal.

3. The stabilized distributed Bragg reflector laser as defined in claim 1 wherein the electrical correction signal is used to modify the index of refraction and change the center wavelength of the pair of Bragg reflector mirrors to stabilize the selected longitudinal mode wavelength emission from the laser.

4. The stabilized distributed Bragg reflector laser as defined in claim 1 wherein the first and second Bragg reflector mirrors are disposed at opposite ends of the gain section along the wave path.

5. The stabilized distributed Bragg reflector laser as defined in claim 1 wherein the laser further comprises a phase section disposed between the gain section and the first Bragg reflector mirror, said phase section including a medium with an adjustable index of refraction for controlling the wavelengths of the longitudinal modes of the laser.

6. The stabilized distributed Bragg reflector laser as defined in claim 5 wherein the electrical correction feedback signal is applied as an input to the phase section and used to adjust the index of refraction of said gain section relative to the pair of Bragg reflector mirrors and stabilize the laser emission.

7. The stabilized distributed Bragg reflector laser as defined in claim 5 wherein the wave path exiting the phase section is split into a pair of parallel, bifurcated wave paths, with a separate Bragg reflector mirror of said pair of Bragg reflector mirrors disposed along each bifurcated wave path.

* * * * *

UNITED STATES PATENT AND TRADEMARK OFFICE
CERTIFICATE OF CORRECTION

PATENT NO. : 6,359,915 B1  
DATED : March 19, 2002  
INVENTOR(S) : Thomas L. Koch and Xing Pan It is certified that error appears in the above-identified patent and that said Letters Patent is hereby corrected as shown below:

<u>Title page,</u>
Item [73], the assignee should read: -- Agere Systems Guardian Corp.--

Signed and Sealed this

Twenty-seventh Day of August, 2002

*Attest:*

JAMES E. ROGAN
*Attesting Officer*  *Director of the United States Patent and Trademark Office*